(12) United States Patent
Tsai

(10) Patent No.: US 7,842,597 B2
(45) Date of Patent: Nov. 30, 2010

(54) CHIP PACKAGE, CHIP PACKAGING, CHIP CARRIER AND PROCESS THEREOF

(75) Inventor: Yu-Pin Tsai, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 852 days.

(21) Appl. No.: 11/162,898

(22) Filed: Sep. 27, 2005

(65) Prior Publication Data
US 2006/0088955 A1   Apr. 27, 2006

(30) Foreign Application Priority Data
Oct. 26, 2004   (TW) ............... 93132321 A

(51) Int. Cl.
*H01L 21/44* (2006.01)
(52) U.S. Cl. .............. 438/613; 438/637; 257/686; 257/692; 257/698; 257/738; 257/E23.067
(58) Field of Classification Search .......... 257/686, 257/E23.067, 613, 637, 692, 698, 738; 438/613, 438/637
See application file for complete search history.

(56) References Cited

U.S. PATENT DOCUMENTS

| | | | |
|---|---|---|---|
| 6,879,492 B2 * | 4/2005 | Alcoe et al. ............... | 361/748 |
| 6,962,829 B2 * | 11/2005 | Glenn et al. .............. | 438/33 |
| 7,132,741 B1 * | 11/2006 | Lin et al. ................. | 257/696 |
| 7,232,754 B2 * | 6/2007 | Kirby et al. .............. | 438/667 |
| 2004/0115919 A1 * | 6/2004 | Takaoka ................... | 438/613 |
| 2004/0124518 A1 * | 7/2004 | Karnezos ................. | 257/686 |
| 2005/0121768 A1 * | 6/2005 | Edelstein et al. ........ | 257/698 |

* cited by examiner

*Primary Examiner*—Wael M Fahmy
*Assistant Examiner*—John C Ingham
(74) *Attorney, Agent, or Firm*—Jianq Chyun IP Office

(57) ABSTRACT

A chip package includes a semiconductor substrate, conductive plugs and a chip. Wherein, the conductive plugs perforate the semiconductor substrate. Besides, the chip is disposed on a surface of the semiconductor substrate and electrically connected to the conductive plugs. Based on the above-described design, the chip package is capable of reducing the thermal stress problem caused by a coefficient of thermal expansion (CTE) dismatch compared with the prior art. The present invention discloses further a chip packaging process and furthermore a chip carrier and the process thereof.

23 Claims, 4 Drawing Sheets

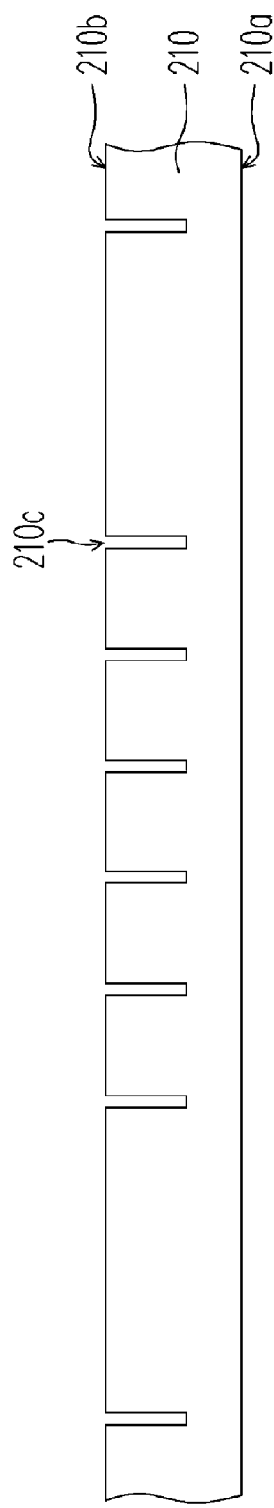
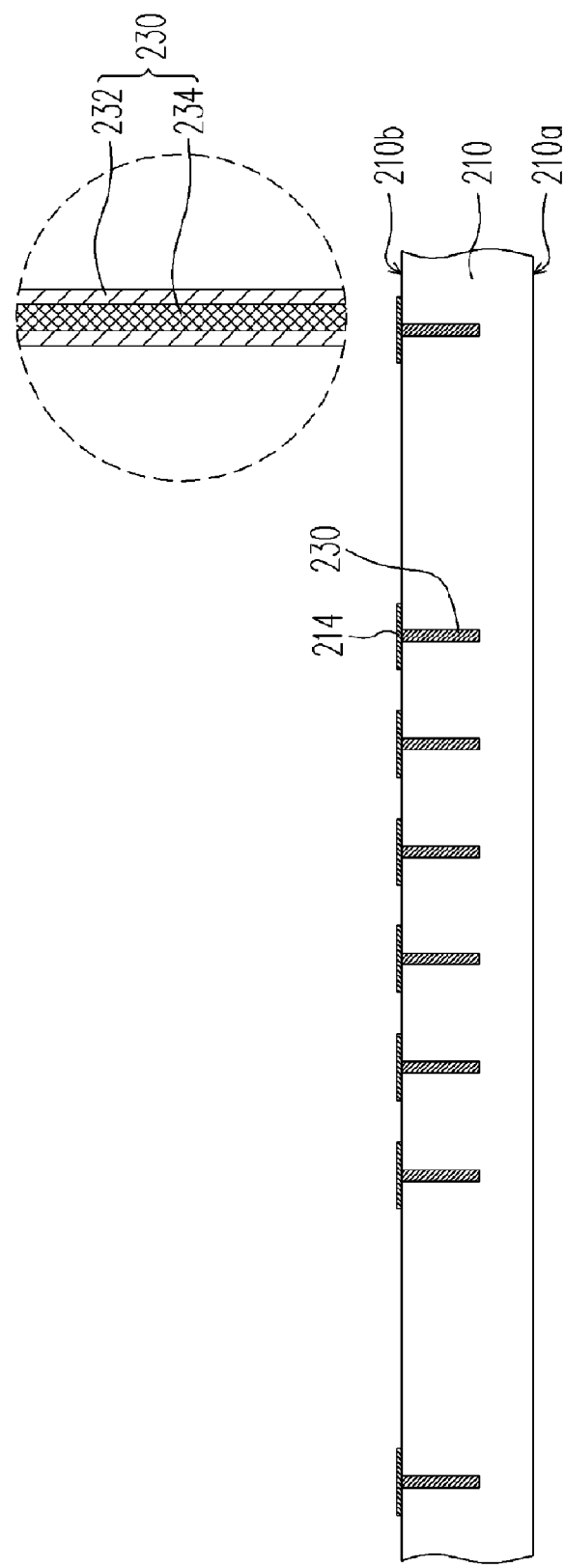
FIG. 3A
FIG. 3B

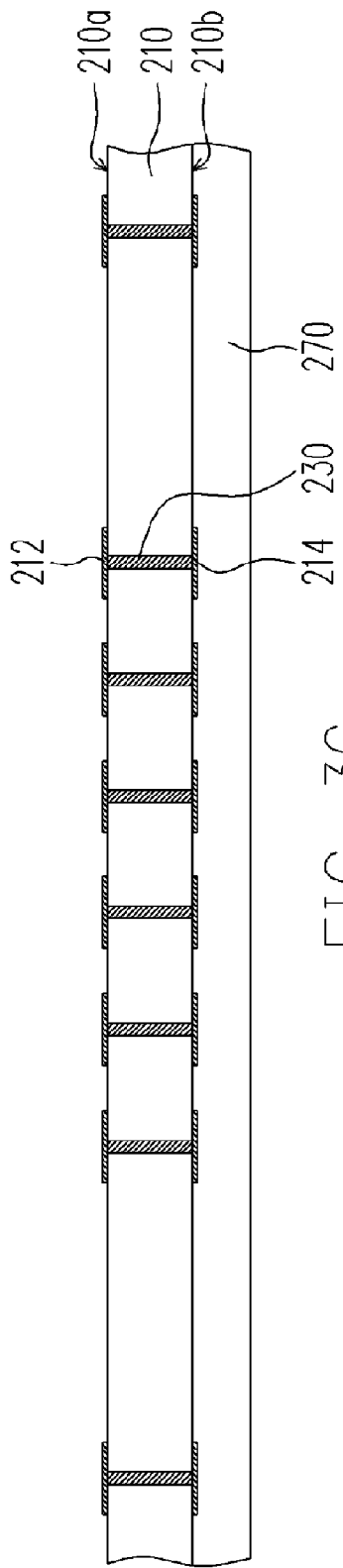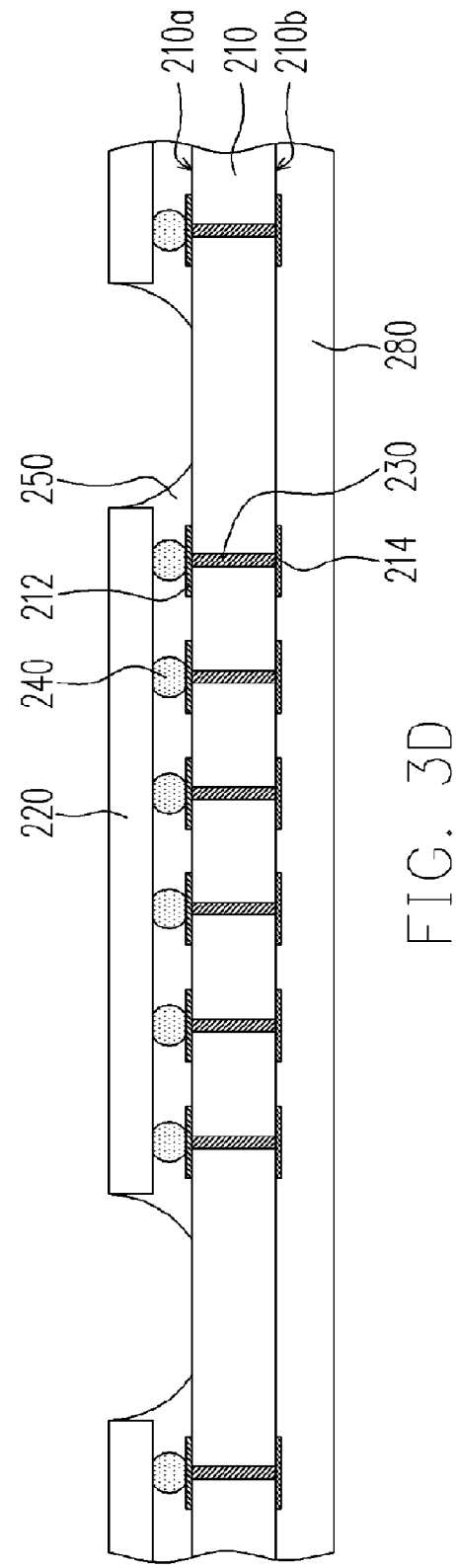

CHIP PACKAGE, CHIP PACKAGING, CHIP CARRIER AND PROCESS THEREOF

CROSS-REFERENCE TO RELATED APPLICATION

This application claims the priority benefit of Taiwan application serial no. 93132321, filed on Oct. 26, 2004. All disclosure of the Taiwan application is incorporated herein by reference.

BACKGROUND OF THE INVENTION

1. Field of Invention

The present invention relates to a chip package and the packaging process thereof, and particularly to a chip package using a semiconductor substrate as the carrier and the packaging process thereof.

2. Description of the Related Art

Along with constant advances and developments of semiconductor processes, various high-efficiency electronic products have been launched in the market. Thanks to the fast advances in semiconductor processes, the integrity of integrated circuit (IC) devices is continuously higher and higher, too. In the packaging process of an IC device, IC packaging plays a decisive role. In terms of IC packaging type, three types are often used: wire bonding (WB) packaging, tape automatic bonding (TAB) packaging and flip chip (FC) packaging. Each of the packaging types has unique characteristics and applicable fields. In spite of which IC packaging is used, a carrier is always needed within an IC package. The leads on a carrier are electrically connected to bonding pads on the chip, wherein the carrier may be a lead frame or a package substrate.

FIG. 1 is a schematic section view of a conventional flip chip package. Referring to FIG. 1, a conventional flip chip package 100 includes a package substrate 110, a chip 120, bumps 130, an underfill 140 and solder balls 150. The above-mentioned package substrate 110 has a first surface 110a and a second surface 110b, while the chip 120 is disposed between the first surface 110a and the second surface 110b of the package substrate 110. Besides, the bumps 130 are disposed between the chip 120 and the package substrate 110; and the chip 120 is electrically connected to the package substrate 110 via the bumps 130. The underfill 140 is disposed between the chip 120 and the package substrate 110 for encapsulating the bumps 130. The solder balls 150 are disposed on the second surface 110b of the package substrate 110 and electrically connected to the chip via the package substrate 110 and the bumps 130.

For a conventional flip chip package, the percentage of a material cost of the package substrate 110 over the total cost increases with the increased density of wiring layout. Besides, the internal conductive trace of the package substrate 110 is likely to be disconnected due to the shrinkage of thickness thereof. In particular, along with the continuously enhancing performance of a chip, the coefficient of thermal expansion (CTE) dismatch between the package substrate 110 and the chip 120 would gradually deteriorate the thermal stress problem.

SUMMARY OF THE INVENTION

Based on the above-described background, an object of the present invention is to provide a chip package for reducing the thermal stress problem caused by the CTE dismatch.

Another object of the present invention is to provide a chip packaging process for fabricating chip packages with lower cost.

A further object of the present invention is to provide a chip carrier with the CTE close to the CTE of the chip.

A further object of the present invention is to provide a process of chip carriers for fabricating chip carriers with lower cost.

Based on the above-described objects or others, the present invention provides a chip package, which includes a semiconductor substrate, conductive plugs and a chip. Wherein, the semiconductor substrate has a first surface and a second surface. The conductive plugs perforate the semiconductor substrate and the chip is disposed on the first surface of the semiconductor substrate and electrically connected to the conductive plugs.

According to an embodiment of the present invention, each of the above-described conductive plugs includes a core conductive layer and a metal layer surrounding the core conductive layer. The material of the core conductive layer can be solder paste or metal.

According to an embodiment of the present invention, the above-described chip package further includes bumps disposed between the chip and the semiconductor substrate; and the chip is electrically connected to the conductive plugs through the bumps. In addition, the chip package further includes an underfill disposed between the chip and the semiconductor substrate for encapsulating the bumps.

According to an embodiment of the present invention, the above-described chip package further includes conductive wires electrically connected between the chip and the semiconductor substrate. Besides, the chip package further includes an underfill disposed on the first surface of the semiconductor substrate for encapsulating the chip and the conductive wires.

According to an embodiment of the present invention, the above-described chip package further includes solder balls disposed on the second surface of the semiconductor substrate; and the solder balls are electrically connected to the conductive plugs.

According to an embodiment of the present invention, the above-described semiconductor substrate has first bonding pads disposed on the first surface and electrically connected to the conductive plugs.

According to an embodiment of the present invention, the above-described semiconductor substrate has a first redistribution layer (RDL), which is disposed on the first surface and electrically connected to the conductive plugs. Besides, the above-described semiconductor substrate can further have a second redistribution layer, which is disposed on the second surface and electrically connected to the first redistribution layer via the conductive plugs.

According to an embodiment of the present invention, the above-described semiconductor substrate has second bonding pads disposed on the second surface and electrically connected to the conductive plugs.

According to an embodiment of the present invention, the above-described semiconductor substrate has a second redistribution layer disposed on the second surface and electrically connected to the conductive plugs.

Based on the above-described objects or others, the present invention provides a chip packaging process, which includes the steps as follows. First, a semiconductor substrate is provided, which has a first surface and a second surface. Next, on the second surface of the semiconductor substrate, blind vias are formed. Inside the blind vias, conductive plugs are formed, while an end of each conductive plug is exposed out of the corresponding blind via. Afterwards, the second surface of the semiconductor substrate is lapped for exposing another end of each conductive plug. Further, on the first surface or the second surface of the semiconductor substrate, chips are disposed, wherein each chip is electrically connected to the corresponding conductive plug.

According to an embodiment of the present invention, the above-described step for forming conductive plugs inside the blind vias can be a via filling plating.

According to an embodiment of the present invention, the above-described step for forming conductive plugs inside the blind vias includes forming a metal layer on the inner wall of each blind via followed by forming a core conductive layer inside each blind via. Wherein, the metal layer is surrounding the corresponding core conductive layer.

According to an embodiment of the present invention, the above-described step for forming the blind vias on the semiconductor substrate can be a laser drilling process.

According to an embodiment of the present invention, the above-described chip packaging process further includes to conduct a dicing process on the semiconductor substrate after lapping the semiconductor substrate but prior to disposing the chips.

According to an embodiment of the present invention, the above-described chip packaging process further includes forming bumps on the chips or on the semiconductor substrate prior to disposing the chips; each chip is electrically connected to the corresponding conductive plug via the corresponding bump.

According to an embodiment of the present invention, the above-described chip packaging process further includes forming an underfill between each chip and the semiconductor substrate for encapsulating the corresponding bump after disposing the chips; then forming solder balls on the semiconductor substrate. Wherein, the chip and the solder balls are disposed on the first surface and the second surface of the semiconductor substrate, respectively. The solder balls are electrically connected to the conductive plugs.

According to an embodiment of the present invention, the above-described chip packaging process further includes a dicing process on the semiconductor substrate after disposing the chips but prior to forming the underfill.

According to an embodiment of the present invention, the above-described chip packaging process further includes a dicing process on the semiconductor substrate after forming the underfill but prior to forming the solder balls.

According to an embodiment of the present invention, the above-described chip packaging process further includes forming conductive wires during disposing the chips, and each chip is electrically connected to the corresponding conductive plug via the corresponding conductive wire.

According to an embodiment of the present invention, the above-described chip packaging process further includes forming an encapsulant on each chip for encapsulating the corresponding conductive wires after disposing the chips. Then, solder balls are formed on the semiconductor substrate. Wherein, the chips and the solder balls are disposed on the first surface and the second surface of the semiconductor substrate, respectively; and the solder balls are electrically connected to the conductive plugs.

According to an embodiment of the present invention, the above-described chip packaging process further includes a dicing process on the semiconductor substrate after disposing the chips but prior to forming the encapsulant.

According to an embodiment of the present invention, the above-described chip packaging process further includes a dicing process on the semiconductor substrate after forming the encapsulant but prior to forming the solder balls.

According to an embodiment of the present invention, the above-described chip packaging process further includes forming first bonding pads on the first surface prior to disposing the chips; and the first bonding pads are electrically connected to the corresponding conductive plugs, respectively.

According to an embodiment of the present invention, the above-described chip packaging process further includes forming a first redistribution layer on the first surface prior to disposing the chips; and the first redistribution layer is electrically connected to the conductive plugs. Besides, after lapping the semiconductor substrate, the above-described chip packaging process further includes forming a second redistribution layer on the second surface and the second redistribution layer is electrically connected to the first redistribution layer via the conductive plugs.

According to an embodiment of the present invention, the above-described chip packaging process further includes forming second bonding pads on the second surface prior to disposing the chips; and the second bonding pads are electrically connected to the conductive plugs, respectively.

According to an embodiment of the present invention, the above-described chip packaging process further includes forming a second redistribution layer on the second surface prior to disposing the chips; and the second redistribution layer is electrically connected to the conductive plugs.

Based on the above-described objects or others, the present invention provides a chip carrier, which includes a semiconductor substrate and conductive plugs. Wherein, the semiconductor substrate has a first surface and a second surface. Besides, the conductive plugs perforate the semiconductor substrate.

According to an embodiment of the present invention, each of the above-described conductive plugs includes a core conductive layer and a metal layer surrounding the core conductive layer. The material of the core conductive layer can be solder paste or metal.

According to an embodiment of the present invention, the above-described chip carrier further includes first bonding pads disposed on the first surface of the semiconductor substrate and the first bonding pads are electrically connected to the corresponding conductive plugs, respectively.

According to an embodiment of the present invention, the above-described chip carrier further includes a first redistribution layer disposed on the first surface; and the first redistribution layer is electrically connected to the conductive plugs. Besides, the chip carrier further includes a second redistribution layer disposed on the second surface of the semiconductor substrate; and the second redistribution layer is electrically connected to the first RDL via the conductive plugs.

According to an embodiment of the present invention, the above-described chip carrier further includes second bonding pads disposed on the second surface of the semiconductor substrate; and the second bonding pads are electrically connected to the corresponding conductive plugs, respectively.

According to an embodiment of the present invention, the above-described chip carrier further includes a second redistribution layer disposed on the second surface of the semiconductor substrate; and the second redistribution layer is electrically connected to the conductive plugs.

Based on the above-described objects or others, the present invention provides a chip carrier process, which includes the following steps. First, a semiconductor substrate is provided, which has a first surface and a second surface. Next, on the second surface of the semiconductor substrate, blind vias are formed. Inside the blind vias, conductive plugs are formed, and an end of each conductive plug is exposed out of the corresponding blind via. Afterwards, the second surface of the semiconductor substrate is lapped for exposing another end of each conductive plug.

According to an embodiment of the present invention, the above-described step for forming conductive plugs inside the blind vias can be a via filling plating.

According to an embodiment of the present invention, the above-described step for forming conductive plugs inside the blind vias includes forming a metal layer on the inner wall of each blind via followed by forming a core conductive layer inside each blind via. Wherein, the metal layer is surrounding the corresponding core conductive layer.

According to an embodiment of the present invention, the above-described step for forming the blind vias on the semiconductor substrate can be a laser drilling process.

According to an embodiment of the present invention, the above-described chip carrier process further includes to conduct a dicing process on the semiconductor substrate after lapping the semiconductor substrate.

According to an embodiment of the present invention, the above-described chip carrier process further includes forming first bonding pads on the first surface prior to lapping the semiconductor substrate; and the first bonding pads are electrically connected to the corresponding conductive plugs, respectively.

According to an embodiment of the present invention, the above-described chip carrier process further includes forming a first redistribution layer on the first surface prior to lapping the semiconductor substrate; and the first redistribution layer is electrically connected to the conductive plugs. Besides, after lapping the semiconductor substrate, a second redistribution layer can further be formed on the second surface; and the second redistribution layer is electrically connected to the first redistribution layer via the conductive plugs.

According to an embodiment of the present invention, the above-described chip carrier process further includes forming second bonding pads on the second surface after lapping the semiconductor substrate; and the second bonding pads are electrically connected to the conductive plugs, respectively.

According to an embodiment of the present invention, the above-described chip carrier process further includes forming a second redistribution layer on the second surface after lapping the semiconductor substrate; and the second redistribution layer is electrically connected to the conductive plugs.

Based on the above described, since the present invention adopts a semiconductor substrate as the chip carrier, the chip package provided by the present invention is capable of eliminating the thermal stress problem caused by CTE dismatch. Hence, the chip package provided by the present invention has a heat dissipation performance better than that of the prior art.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

FIG. 3A-FIG. 3D are schematic section views showing a flip chip packaging flowchart according to the first embodiment of the present invention.

DESCRIPTION OF THE EMBODIMENTS

The First Embodiment

Figure 1:
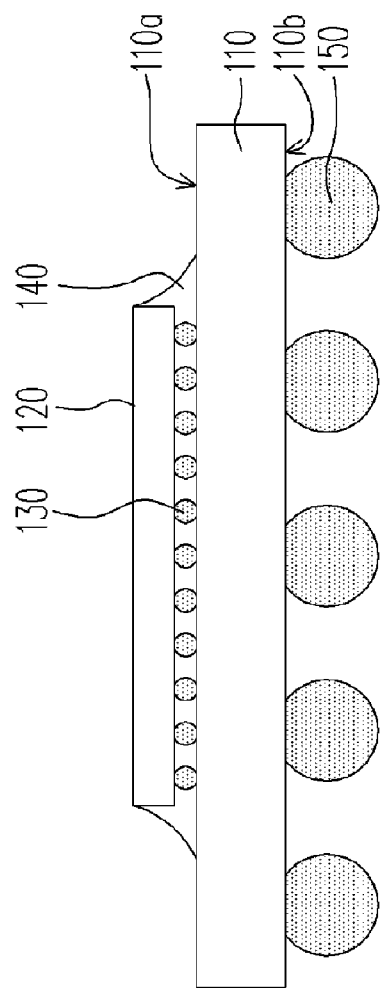
FIG. 1 is a schematic section view of a conventional flip chip package.
Figure 2:
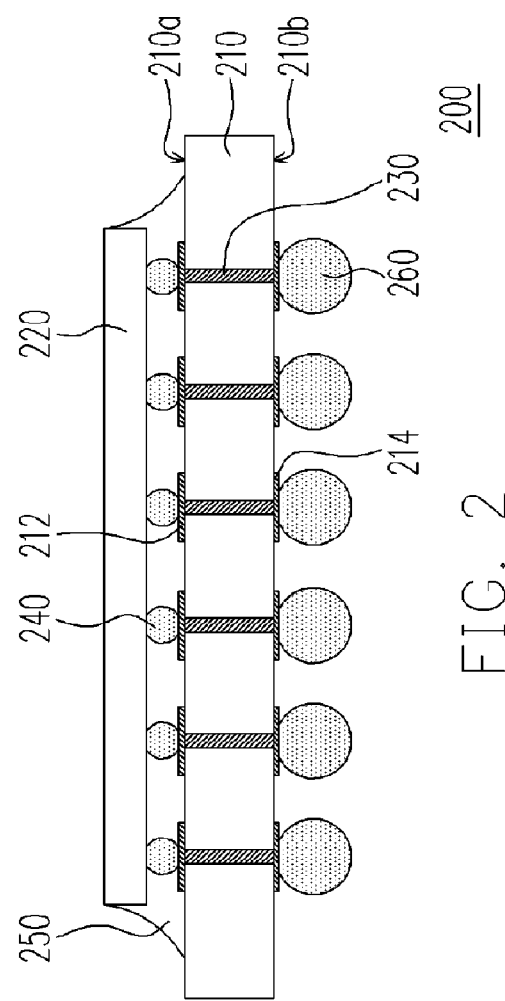
FIG. 2 is a schematic section view of a flip chip package according to the first embodiment of the present invention.

FIG. 2 is a schematic section view of a flip chip package according to the first embodiment of the present invention. Referring to FIG. 2, a chip package 200 includes a semiconductor substrate 210, a chip 220 and conductive plugs 230, wherein the semiconductor substrate 210 has a first surface 210a and a second surface 210b; while the material of the semiconductor substrate 210 can be silicon or an element of group □-V. The conductive plugs 230 perforate the semiconductor substrate 210; and the material of the conductive plugs 230 can be copper or other conductors. The chip 220 is disposed on the first surface 210a and electrically connected to the conductive plugs 230.

The chip 220 can be electrically connected to the conductive plugs 230 in flip chip bonding. In other words, the chip package 200 further includes bumps 240 and an underfill 250. Wherein, the bumps 240 are disposed between the chip 220 and the semiconductor substrate 210; and the chip 220 is electrically connected to the conductive plugs 230 via the bumps 240. For protecting the bumps 240, the underfill 250 is employed and disposed between the chip 220 and the semiconductor substrate 210 for encapsulating the bumps 240. In addition, to dispose the semiconductor substrate 210 on a circuit board later on (not shown in the figure), the chip package 200 further includes solder balls 260 disposed on the second surface 210b of the semiconductor substrate 210; and the solder balls 260 are electrically connected to the chip 220 via the conductive plugs 230. Remarkably, the present invention does not limit to the use of solder balls 260 only. In fact, pin-like leads or other leads can also be used.

Continuing to FIG. 2 for more details, the chip package 200 further includes bonding pads 212 and 214, so that the bumps 240 and the solder balls 260 are able to be disposed on the first surface 210a and the second surface 210b of the semiconductor substrate 210, respectively. The above-described bonding pads 212 are disposed on the first surface 210a of the semiconductor substrate 210; hence, the bumps 240 are electrically connected to the conductive plugs 230 via the bonding pads 212. While the bonding pads 214 are disposed on the second surface 210b of the semiconductor substrate 210, the solder balls 260 are electrically connected to the conductive plugs 230 via the bonding pads 214. Remarkably, the present invention does not limit to the use of the bonding pads 212 and 214 only. In fact, the solder balls 260 and the bumps 240 can be directly connected to the conductive plugs 230, too.

As described, in comparison with the prior art where a high-density package substrate is employed, the present invention employs a cost-saving semiconductor substrate 210 as a carrier of the chip 220, which not only enables the chip package of the present invention to reduce production cost, but also to further reduce the thickness thereof. Remarkably, since the material of the semiconductor substrate 210 and the material of the chip 220 are similar to each other, the CTE of the semiconductor substrate 210 and the chip 220 are consequently close to each other. In other words, compared with the prior art, the chip package 200 of the present invention is expected to reduce the thermal stress problem caused by CTE dismatch. The flowchart for fabricating the chip package 200 would be described hereafter.

FIG. 3A-FIG. 3D are schematic section views showing a flip chip packaging flowchart according to the first embodiment of the present invention. Referring to FIG. 3A, the chip packaging process in the first embodiment includes the steps as follows. First, a semiconductor substrate 210 is provided, which has a first surface 210a and a second surface 210b. Wherein, the semiconductor substrate 210 can be a dummy wafer or other semiconductor substrate without forming any circuit layer yet. Next, blind vias 210c are formed on the second surface 210b of the semiconductor substrate 210, wherein the method for forming the blind vias can be a laser drilling process or other precision drilling processes.

Referring to FIG. 3B, conductive plugs 230 are formed inside the blind vias 210c, wherein an end of each conductive plug 230 is exposed out of the blind via 210c; and the method for forming the conductive plugs 230 can be a via filling plating or other processes capable for forming a conductive layer. Remarkably, the bonding pads 214 and the conductive plugs 230 can be simultaneously formed. For example, a conductive material layer (not shown in the figure) is formed on the second surface 210b of the semiconductor substrate 210, and then the conductive material layer is patterned.

Referring to the localized enlarged view of FIG. 3B, in another embodiment, the method for forming the conductive plugs 230 can be first forming a metal layer 232 on the inner walls of the blind vias 210c; the method of forming the metal layer can be a plating process. Then, a core conductive layer 234 is formed inside each of the blind vias 210c; and the metal layer 232 is disposed surrounding the core conductive layer 234. Besides, the method for forming the core conductive layer 234 can be plating a metal layer or filling a solder paste.

Referring to FIG. 3C, after forming the conductive plugs 230, a lapping process is conducted on the semiconductor substrate 210 for exposing another end of each conductive plug 230. At the point, the conductive plugs 230 perforate the semiconductor substrate 210. After lapping the semiconductor substrate 210, bonding pads 212 are formed on the first surface 210a of the semiconductor substrate 210 and the bonding pads 212 are connected to the conductive plugs 230, respectively. The method for forming the bonding pads 212 can be forming a conductive material layer (not shown in the figure) on the first surface 210a of the semiconductor substrate 210 first followed by patterning the conductive material layer. To avoid a possible damage of the wiring on the second surface 210b of the semiconductor substrate 210 during the lapping, a lapping protection layer 270 is disposed on the second surface 210b of the semiconductor substrate 210 prior lapping the semiconductor substrate 210; and the lapping protection layer 270 must be removed after the semiconductor substrate 210 has been lapped.

Referring to FIG. 3D, chips 220 are disposed on the first surface 210a of the semiconductor substrate 210, wherein each chip 220 is electrically connected to the corresponding conductive plug 230. In more detail, bumps 240 are formed on the first surface 210a of the semiconductor substrate 210 or on the chips 220; and the chips 220 are electrically connected to the conductive plugs 230 via the bumps 240 and the bonding pads 212. Afterwards, an underfill 250 is formed between the chip 220 and the first surface 210a of the semiconductor substrate 210 for encapsulating the bumps 240. Further, a dicing process on the semiconductor substrate 210 is conducted. Wherein, prior to dicing the semiconductor substrate 210, a dicing protection layer 280 is disposed on the semiconductor substrate 210 and is to be removed after the dicing process. Finally, solder balls 260 are formed on the second surface 210b of the semiconductor substrate 210 for forming the chip package 200 as shown in FIG. 2. Remarkably, the embodiment does not limit the chip 220 to be disposed on the semiconductor substrate 210 only. In fact, the chip 220 can be disposed on the second surface 210b of the semiconductor substrate 210.

Remarkably, in an embodiment, prior to disposing the chip 220, a dicing process can be conducted to the semiconductor substrate 210 first. Then, the bumps 240 are formed on the first surface 210a of the semiconductor substrate 210 or on the chip 220. Further, the underfill 250 is filled between the semiconductor substrate 210 and the chip 220. Furthermore, the solder balls 260 are formed on the second surface 210b of the semiconductor substrate 210.

In another embodiment, after disposing the chip 220 but prior to forming the underfill 250, a dicing process on the semiconductor substrate 210 is conducted. Then, the underfill 250 is filled between the semiconductor substrate 210 and the chip 220. Further, the solder balls 260 are formed on the second surface 210b of the semiconductor substrate 210. In other words, the present invention does not limit the processing sequence of, such as, dicing the semiconductor substrate 210, disposing the chip 220 and forming the underfill 250. Besides, prior to the dicing process in all the embodiments, a dicing protection layer 280 can be disposed on the semiconductor substrate 210 first and removed after the dicing process. Similarly, prior to the lapping process in all the embodiments, a lapping protection layer 270 can be disposed on the semiconductor substrate 210 first and removed after the dicing process.

The Second Embodiment

Figure 4:
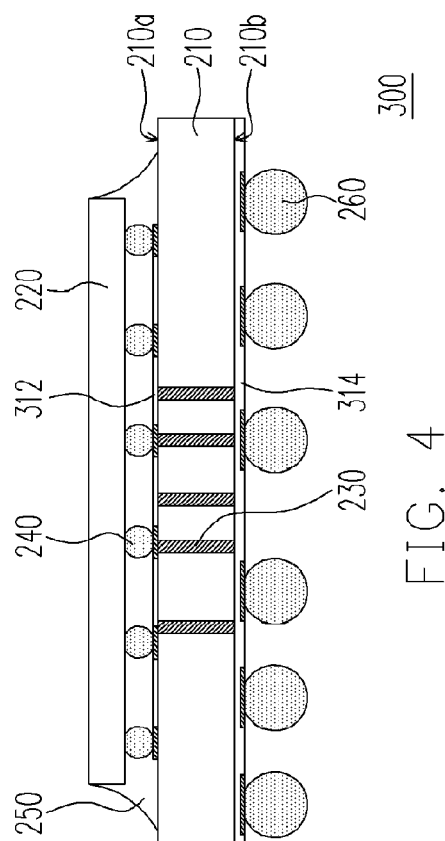
FIG. 4 is a schematic section view of a flip chip package according to the second embodiment of the present invention.

FIG. 4 is a schematic section view of a flip chip package according to the second embodiment of the present invention. Referring to FIG. 4, the unique point of the second embodiment from the first embodiment is that in the chip package of the second embodiment, a redistribution layer 312 and a redistribution layer 314 are disposed on the first surface 210a and the second surface 210b of the semiconductor substrate 210, respectively. That is, the bumps 240 are electrically connected to the conductive plugs 230 via the redistribution layer 312, while the solder balls 260 are electrically connected to the conductive plugs 230 via the redistribution layer 314.

Continuing to FIG. 4, the step for forming the redistribution layer 314 can be arranged after forming the conductive plugs 230 but prior to lapping the semiconductor substrate 210. Moreover, the step for forming the RDL 312 can be arranged after lapping the semiconductor substrate 210 but prior to disposing the chip 220. Remarkably, the redistribution layer 314 in the second embodiment can functionally substitute the bonding pads 214 in the first embodiment for modifying the positions of the solder balls 260 in the first embodiment.

Due to the existence of the redistribution layer 312 and 314, the positions of the conductive plugs 230 are not restricted, which enable the conductive plugs 230 to be more concentrically disposed for a bigger wiring area. In this way, the space between the bumps is not restricted by the space between the solder balls 260. In addition, the conductive plugs 230 serve not only for transmitting signals, but also as an effective heat dissipation access. Hence, the chip package 300 provided by the present invention is not only to reduce the thermal stress problem caused by a CTE dismatch, but also to improve heat dissipation efficiency of the chip 220.

The Third Embodiment

Figure 5:
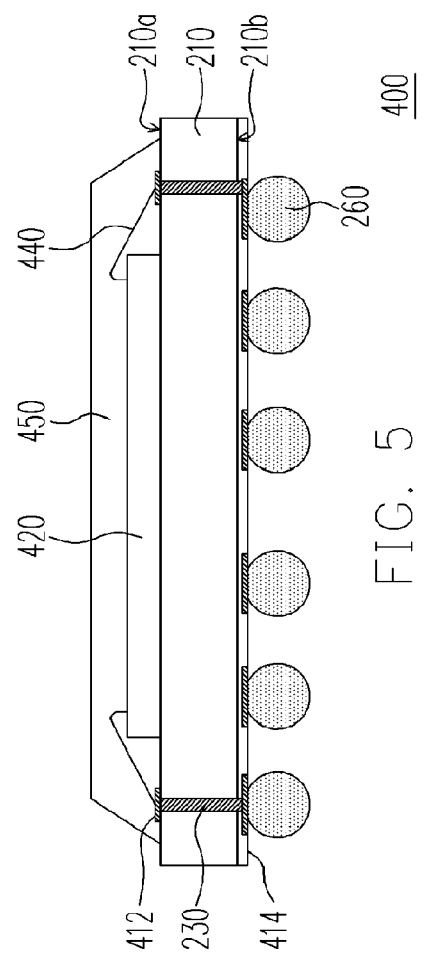
FIG. 5 is a schematic section view of a flip chip package according to the third embodiment of the present invention.

FIG. 5 is a schematic section view of a flip chip package according to the third embodiment of the present invention. The unique point of the third embodiment from the first embodiment is that in the chip package 400 of the third embodiment, the chip 420 is electrically connected to the semiconductor substrate 210 by wire bonding technology. Herein, the chip 420 is electrically connected to the semiconductor substrate 210 via conductive wires 440.

In more detail, bonding pads 412 are disposed on the first surface 210a of the semiconductor substrate 210, while an redistribution layer 414 is disposed on the second surface 210b of the semiconductor substrate 210. The above-described chip is electrically connected to the solder balls 260 via the conductive wires 440, the bonding pads 412, the conductive plugs 230 and the redistribution layer 414. Besides, an encapsulant 450 is disposed on the first surface 210a of the semiconductor substrate 210 for encapsulating the chip 420 and the conductive wires 440. The rest processes for forming the chip package 400 is similar to that in the first embodiment; and for simplicity, it is omitted herein.

Noticeably, the chip 220 in the second embodiment can be electrically connected to the conductive plugs 230 by wire bonding technology, too. In other words, in all three the above-described embodiments, the chips 420 or 220 can be electrically connected to the conductive plugs 230 by flip chip bonding technology or wire bonding technology.

From the above, it can be seen that the chip package and the packaging process thereof provided by the present invention has at least the following advantages.

1. In comparison with the prior art where an expensive package substrate is employed, the present invention adopts a semiconductor substrate as the chip carrier; therefore the chip package of the present invention not only saves cost significantly, but also is capable of reducing the thermal stress problem caused by a CTE dismatch.

2. In comparison with the prior art, the chip package of the present invention not only reduces the thickness thereof, but also enhances the heat dissipation performance of the chip.

3. In comparison with the prior art, the chip package of the present invention allows more quantity of the lead pins per unit area.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A chip packaging process, comprising:
providing a semiconductor substrate having a first surface and a second surface;
forming a plurality of blind vias on the second surface of the semiconductor substrate;
forming a plurality of conductive plugs inside the blind vias, wherein an end of each conductive plug is exposed out of the blind via;
lapping the first surface of the semiconductor substrate for exposing another end of each conductive plug;
after lapping the semiconductor substrate, performing a dicing process to the semiconductor substrate;
after the dicing process, disposing a plurality of chips on the first surface of the semiconductor substrate, wherein each chip is electrically connected to the corresponding conductive plug; and
forming a plurality of solder balls on the semiconductor substrate, wherein the solder balls are disposed on the second surface of the semiconductor substrate, while the solder balls are electrically connected to the conductive plugs.

2. The chip packaging process as recited in claim 1, wherein the method for forming the conductive plugs inside the blind vias comprises via filling plating process.

3. The chip packaging process as recited in claim 1, wherein the method for forming the conductive plugs inside the blind vias comprises:
forming a metal layer on the inner wall of each blind via; and
forming a core conductive layer inside each blind via, wherein the metal layer is surrounding the core conductive layer.

4. The chip packaging process as recited in claim 1, wherein the method for forming the blind vias on the semiconductor substrate comprises laser drilling process.

5. The chip packaging process as recited in claim 1, wherein the method for electrically connecting the chips to the semiconductor substrate comprises forming a plurality of conductive wires, wherein each chip is electrically connected to the corresponding conductive plug via the corresponding conductive wires.

6. The chip packaging process as recited in claim 5, wherein after disposing the chips the process further comprises:
forming an underfill on each of the chips for encapsulating the corresponding conductive wires.

7. The chip packaging process as recited in claim 6, wherein prior to disposing the chips the process further comprises forming a plurality of first bonding pads on the first surface, wherein the first bonding pads are electrically connected to the corresponding conductive plugs, respectively.

8. The chip packaging process as recited in claim 1, wherein prior to disposing the chips the process further comprises forming a first redistribution layer on the first surface and the first redistribution layer is electrically connected to the conductive plugs.

9. The chip packaging process as recited in claim 8, wherein prior to disposing the chips the process further comprises forming a second redistribution layer on the second surface and the second redistribution layer is electrically connected to the first redistribution layer via the conductive plugs.

10. The chip packaging process as recited in claim 1, wherein prior to disposing the chips the process further comprises forming a plurality of second bonding pads on the second surface, wherein the second bonding pads are electrically connected to the corresponding conductive plugs, respectively.

11. The chip packaging process as recited in claim 1, wherein prior to disposing the chips the process further comprises forming a second redistribution layer on the second surface and the second redistribution layer is electrically connected to the conductive plugs.

12. A chip packaging process, comprising:
providing a semiconductor substrate having a first surface and a second surface;
forming a plurality of blind vias on the second surface of the semiconductor substrate;
forming a plurality of conductive plugs inside the blind vias, wherein an end of each conductive plug is exposed out of the blind via;
lapping the first surface of the semiconductor substrate for exposing another end of each conductive plug;

disposing a plurality of chips on the first surface of the semiconductor substrate, wherein each chip is electrically connected to the corresponding conductive plug by forming a plurality of bumps on the chips or the semiconductor substrate, wherein each chip is electrically connected to the corresponding conductive plug via the corresponding bump;

after disposing the chips, performing a dicing process to the semiconductor substrate;

after the dicing process, forming an underfill between the chips and the semiconductor substrate for encapsulating the bumps; and forming a plurality of solder balls on the semiconductor substrate, wherein the solder balls are disposed on the second surface of the semiconductor substrate, while the solder balls are electrically connected to the conductive plugs.

13. The chip packaging process as recited in claim 12, wherein the method for forming the conductive plugs inside the blind vias comprises:

forming a metal layer on the inner wall of each blind via; and forming a core conductive layer inside each blind via, wherein the metal layer surrounds the core conductive layer.

14. The chip packaging process as recited in claim 12, wherein prior to disposing the chips the process further comprises forming a plurality of first bonding pads on the first surface, wherein the first bonding pads are electrically connected to the corresponding conductive plugs, respectively.

15. The chip packaging process as recited in claim 12, wherein prior to disposing the chips the process further comprises forming a first redistribution layer on the first surface and the first redistribution layer is electrically connected to the conductive plugs.

16. The chip packaging process as recited in claim 12, wherein prior to disposing the chips the process further comprises forming a plurality of second bonding pads on the second surface, wherein the second bonding pads are electrically connected to the corresponding conductive plugs, respectively.

17. The chip packaging process as recited in claim 12, wherein prior to disposing the chips the process further comprises forming a second redistribution layer on the second surface and the second redistribution layer is electrically connected to the conductive plugs.

18. A chip packaging process, comprising:

providing a semiconductor substrate having a first surface and a second surface;

forming a plurality of blind vias on the second surface of the semiconductor substrate;

forming a plurality of conductive plugs inside the blind vias, wherein an end of each conductive plug is exposed out of the blind via;

lapping the first surface of the semiconductor substrate for exposing another end of each conductive plug;

disposing a plurality of chips on the first surface of the semiconductor substrate, wherein each chip is electrically connected to the corresponding conductive plug by forming a plurality of bumps on the chips or the semiconductor substrate, wherein each chip is electrically connected to the corresponding conductive plug via the corresponding bump;

after disposing the chips, forming an underfill between the chips and the semiconductor substrate for encapsulating the bumps;

after forming the underfill, performing a dicing process to the semiconductor substrate; and after the dicing process, forming a plurality of solder balls on the semiconductor substrate, wherein the solder balls are disposed on the second surface of the semiconductor substrate, while the solder balls are electrically connected to the conductive plugs.

19. The chip packaging process as recited in claim 18, wherein the method for forming the conductive plugs inside the blind vias comprises:

forming a metal layer on the inner wall of each blind via; and forming a core conductive layer inside each blind via, wherein the metal layer surrounds the core conductive layer.

20. The chip packaging process as recited in claim 18, wherein prior to disposing the chips the process further comprises forming a plurality of first bonding pads on the first surface, wherein the first bonding pads are electrically connected to the corresponding conductive plugs, respectively.

21. The chip packaging process as recited in claim 18, wherein prior to disposing the chips the process further comprises forming a first redistribution layer on the first surface and the first redistribution layer is electrically connected to the conductive plugs.

22. The chip packaging process as recited in claim 18, wherein prior to disposing the chips the process further comprises forming a plurality of second bonding pads on the second surface, wherein the second bonding pads are electrically connected to the corresponding conductive plugs, respectively.

23. The chip packaging process as recited in claim 18, wherein prior to disposing the chips the process further comprises forming a second redistribution layer on the second surface and the second redistribution layer is electrically connected to the conductive plugs.

* * * * *